United States Patent
Matsuta

(10) Patent No.: US 6,812,561 B2
(45) Date of Patent: Nov. 2, 2004

(54) THIN HIGH-FREQUENCY MODULE HAVING INTEGRATED CIRCUIT CHIP WITH LITTLE BREAKAGE

(75) Inventor: Shigetoshi Matsuta, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/319,063

(22) Filed: Dec. 13, 2002

(65) Prior Publication Data

US 2003/0122250 A1 Jul. 3, 2003

(30) Foreign Application Priority Data

Dec. 21, 2001 (JP) ........................................ 2001-388878

(51) Int. Cl.[7] .................... H01L 23/22; H01L 23/24; H01L 23/48; H01L 23/52; H01L 23/04; H01L 23/12; H01L 23/053; H01L 23/06; H01L 23/34; H01L 23/15

(52) U.S. Cl. .................... 257/700; 257/687; 257/690; 257/698; 257/701; 257/703; 257/709; 257/724; 257/725; 257/720

(58) Field of Search ................................ 257/687, 690, 257/698, 700, 701, 702, 703, 709, 724, 725, 720

(56) References Cited

U.S. PATENT DOCUMENTS

| | | | | |
|---|---|---|---|---|
| 3,593,174 A | * | 7/1971 | White | 330/286 |
| 5,877,550 A | * | 3/1999 | Suzuki | 257/700 |
| 6,426,551 B1 | * | 7/2002 | Kawakami et al. | 257/700 |
| 2002/0140081 A1 | * | 10/2002 | Chou et al. | 257/700 |

FOREIGN PATENT DOCUMENTS

| | | | |
|---|---|---|---|
| DE | 44 04 298 | 8/1995 | |
| JP | 4-271161 | 9/1992 | |
| JP | 5-275609 | 10/1993 | |
| JP | 8-18001 | 1/1996 | |
| JP | H11-045977 | 2/1999 | |
| JP | 11-045977 | * 2/1999 | ........................ 27/1 |
| JP | 2000-58741 | 2/2000 | |
| JP | 2000-252407 | 9/2000 | |

OTHER PUBLICATIONS

"A Pillar–Shaped Via Structure in A Cu–Polyimide Multi-layer Substrate" Iwasaki N et al., pp. 128–131.

* cited by examiner

*Primary Examiner*—Nathan Flynn
*Assistant Examiner*—Victor A. Mandala, Jr.
(74) *Attorney, Agent, or Firm*—Brinks Hofer Gilson & Lione

(57) ABSTRACT

A high-frequency module of the invention includes an insulating substrate including a plurality of ceramic thin plates stacked in layers, and an insulating layer formed on the top surface of the insulating substrate. In the high-frequency module, a thin-film circuit is formed on the top surface of the insulating layer, and comprises a wiring pattern and an electrical part comprising a resistor and/or a capacitor. The wiring pattern is formed of a thin film. The electrical part is connected to the wiring pattern and is formed of a thin film. Therefore, the electrical part of the high-frequency module of the invention can be formed more precisely than an electrical part of a related high-frequency module. Consequently, it is possible to provide a high-frequency module having high performance.

4 Claims, 1 Drawing Sheet

THIN HIGH-FREQUENCY MODULE HAVING INTEGRATED CIRCUIT CHIP WITH LITTLE BREAKAGE

BACKGROUND OF THE INVENTION

1. Field of the Invention

The present invention relates to a high-frequency module suitable for use in, for example, a voltage controlled oscillator or a transmitting and receiving unit used in a cellular phone.

2. Description of the Related Art

A related high-frequency module has a wiring pattern and an electrical part. The wiring pattern is formed of a thick film and is provided on the surface of an insulating substrate that is formed by stacking materials in layers and between the layers forming the insulating substrate. The electrical part comprising a resistor and/or a capacitor is formed of a thick film and is provided on the surface of the insulating substrate and between the layers forming the insulating substrate.

An integrated circuit (IC) chip, formed of a semiconductor material, is mounted to the wiring pattern, formed on the surface of the insulating substrate, so as to be exposed at and protrude from the surface of the insulating substrate.

Since the electrical part of the related high-frequency module is formed of a thick film, it has large variations in thickness and poor performance.

In addition, since the IC chip is mounted to the surface of the insulating substrate, the related high-frequency module has increased thickness. Therefore, it cannot be made thin, and its IC chip breaks because external force tends to be exerted upon the IC chip in the exposed state.

SUMMARY OF THE INVENTION

Accordingly, it is an object of the present invention to provide a thin, high-performance high-frequency module having an IC chip with little breakage.

To this end, according to the present invention, there is provided a high-frequency module comprising an insulating substrate comprising a plurality of ceramic thin plates stacked in layers, and an insulating layer disposed on a top surface of the insulating substrate. In the high-frequency module, a thin-film circuit is disposed on a top surface of the insulating layer, and comprises a wiring pattern and an electrical part comprising a resistor and/or a capacitor. The wiring pattern is formed of a thin film. The electrical part is connected to the wiring pattern and is formed of a thin film. The insulating substrate has at least one conductive member disposed between the layers forming the insulating substrate, a first connection conductor and a second connection conductor disposed in the thickness direction, and an electrode disposed on a side surface of the insulating substrate with the electrode being connected to the conductive member. The first connection conductor is connected to the wiring pattern, and the second connection conductor is connected to an integrated circuit chip accommodated inside the insulating substrate and to the wiring pattern.

Although not exclusive, the ceramic thin plates forming the insulating substrate may be capable of being baked at a low temperature, and the insulating layer may be formed of glass or polyimide.

Although not exclusive, a top end of each of the connection conductors may have a protrusion which protrudes from the top surface of the insulating substrate, and each protrusion may be flush with or may protrude from the surface of the insulating layer, so that the wiring pattern is in electrical conduction with each protrusion.

Although not exclusive, a sealant, formed of an insulating material, may fill a recess of the insulating substrate accommodating the integrated circuit chip.

Although not exclusive, the integrated circuit chip may be formed of a bare chip.

DESCRIPTION OF THE PREFERRED EMBODIMENT

Figure 1:
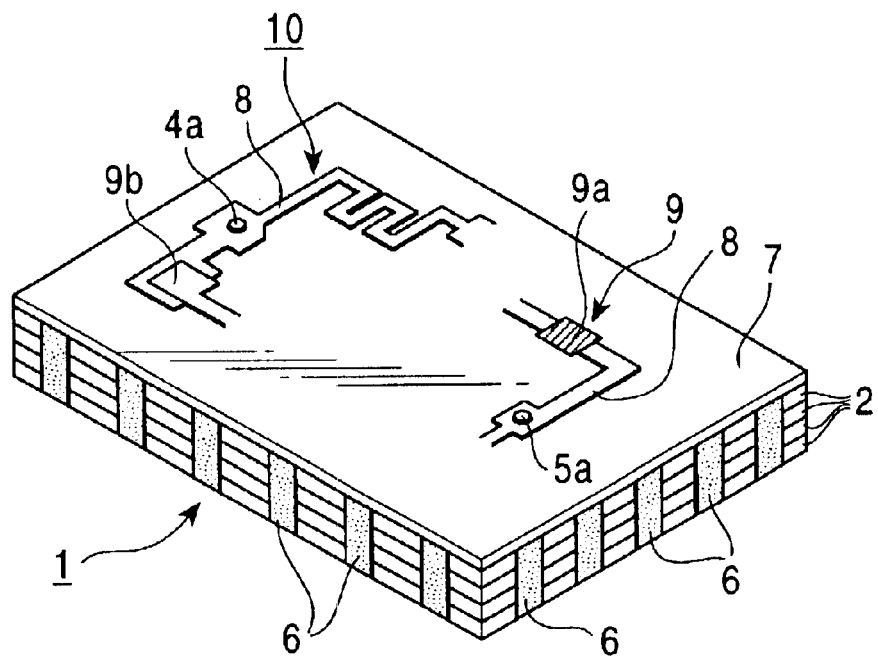
FIG. 1 is a perspective view of a high-frequency module of the present invention.

A description of a high-frequency module of the present invention will be given with reference to the drawings. FIG. 1 is a perspective view of the high-frequency module of the present invention, and FIG. 2 is a sectional view of the main portion of the high-frequency module of the present invention.

Figure 2:
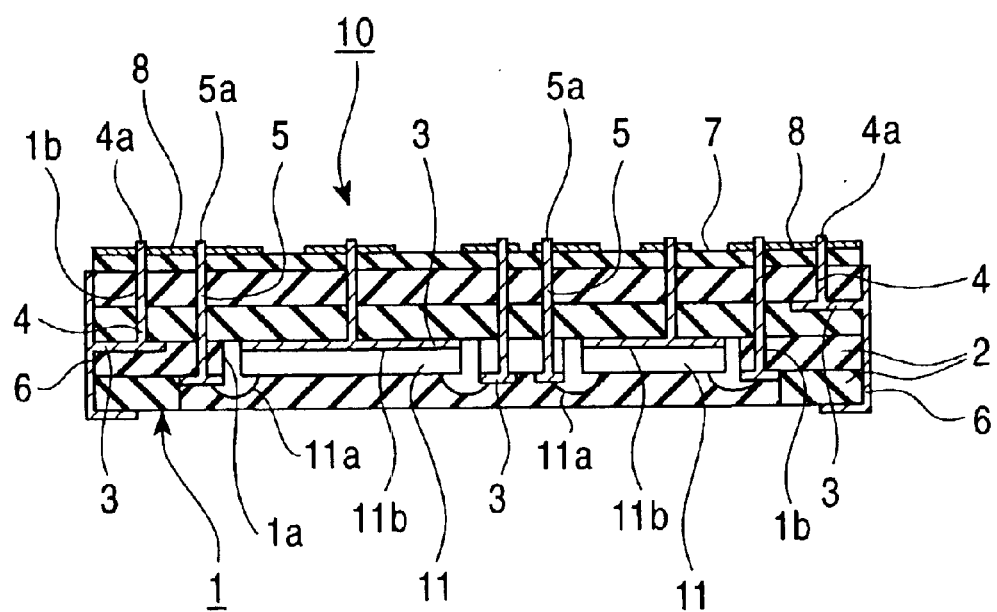
FIG. 2 is a sectional view of the main portion of the high-frequency module of the present invention.

Referring to FIGS. 1 and 2, in the high-frequency module of the present invention, a flat insulating substrate 1 is formed by stacking a plurality of ceramic thin plates 2 in layers, a plurality of recesses 1a are formed in the lower surface of the insulating substrate 1, and a plurality of holes 1b are formed in the thickness direction of the insulating substrate 1.

Conductive members 3 are formed of conductive materials such as silver, are provided between the layers forming the insulating substrate 1 and at the bottom surfaces defining the recesses 1a of the insulating substrate 1, and are positioned in correspondence with the holes 1b.

First connection conductors 4 and second connection conductors 5, formed of conductive materials such as silver, fill the respective holes 1b of the insulating substrate 1. The first connection conductors 4 are connected to the respective conductive members 3 that are formed between the layers forming the insulating substrate 1, and the second connection conductors 5 are connected to the respective conductive members 3 that are formed at the bottom surfaces defining the recesses 1a.

The top end of each first connection conductor 4 and the top end of each second connection conductor 5 have a protrusion 4a and a protrusion 5a, respectively, protruding slightly from the top surface of the insulating substrate 1.

A plurality of electrodes 6, formed of conductive materials such as silver, are provided on the side surfaces of the insulating substrate 1. With the electrodes 6 being connected to the conductive members 3 that are formed between the layers forming the insulating substrate 1, the electrodes 6 are formed in the thickness direction of the insulating substrate 1 and on the bottom surface of the insulating substrate 1.

In the production process of the insulating substrate 1 having such a structure, the plurality of ceramic thin plates 2, which are formed of green sheets (in a raw state) that can be baked at a low temperature (equal to or less than 1000° C.), are stacked. The holes 1b are filled with the first and second connection conductors 4 and 5 (formed of silver paste), so that they are in electrical conduction with their respective conductive members 3 (formed of silver paste), and the electrodes 6 (formed of silver paste) in electrical conduction with the respective conductive members 3 are formed onto the side surfaces of the insulating substrate 1.

Next, the ceramic thin plates 2 are baked in order to sinter them, so that the insulating substrate 1 forming a block member is formed. In addition, the silver pastes are baked in order to form the conductive members 3, the first connection conductors 4, the second connection conductors 5, and the electrodes 6.

At this time, the protrusion 4a at the top end of each first connection conductor 4 and the protrusion 5a at the top end of each second connection conductor 5 are formed protruding from the top surface of the insulating substrate 1.

An insulating layer 7 is formed of, for example, glass, polyimide, SiO$_2$, BCB (benzocyclobutenes), amorphous fluorocarbon resin, silicon nitride, or epoxy resin. The insulating layer 7 is formed on the top surface of the insulating substrate 1 except where the front ends of the protrusions 4a of the first connection conductors 4 and the protrusions 5a of the second connection conductors 5 are formed.

When the insulating layer 7 is formed, the front ends of the protrusions 4a and 5a are flush with or slightly protrude from the surface of the insulating layer 7.

A wiring pattern 8, formed into a thin film by evaporation or the like, is provided on the surface of the insulating layer 7. Being connected to the wiring pattern 8, an electrical part 9 comprising a resistor 9a, a capacitor 9b, and an inductor 9c, formed of thin films, are formed on the surface of the insulating layer 7. By the formation of the wiring pattern 8 and the electrical part 9, a thin-film circuit 10 is formed on the surface of the insulating layer 7.

When the wiring pattern 8 is formed on the surface of the insulating layer 7, the wiring pattern 8 is in electrical conduction with the protrusion 4a of each first connection conductor 4 and the protrusion 5a of each second connection conductor 5, and is electrically led to the electrodes 6, disposed on the side surfaces of the insulating substrate 1, through the first connection conductors 4 and the conductive members 3.

Integrated circuit (IC) chips 11, which are formed using bare chips formed of semiconductor materials, are accommodated inside the recesses 1a of the insulating substrate 1, and leading electrodes 11b and wires 11a of the respective IC chips 11 are connected to the respective conductive members 3.

As a result, the IC chips 11 are connected to the wiring pattern 8 through the conductive members 3 and the second connection conductors 5.

A sealant 12, formed of an insulating material, fills the recesses 1a of the insulating substrate 1, and seals the IC chips 11. By this, the IC chips 11 are protected from outside air and external force. The lower surface of the sealant 12 coincides with the lower surface of the insulating substrate 1, so that the IC chips 11 are stably mounted to the insulating substrate 1.

The high-frequency module having such a structure is placed on a circuit board of an electronic apparatus, and the electrodes 6, disposed on the side surfaces of the insulating substrate 1, are soldered to a conductive pattern on the circuit board, so that the high-frequency module is mounted and wired.

According to the present invention, the high-frequency module comprises an insulating substrate comprising a plurality of ceramic thin plates stacked in layers, and an insulating layer disposed on the top surface of the insulating substrate. In the high-frequency module, a thin-film circuit is disposed on the top surface of the insulating layer, and comprises a wiring pattern and an electrical part comprising a resistor and/or a capacitor. The wiring pattern is formed of a thin film. The electrical part is connected to the wiring pattern and is formed of a thin film. Therefore, the electrical part of the high-frequency module of the present invention can be formed more precisely than an electrical part of a related high-frequency module. Consequently, it is possible to provide a high-frequency module having high performance.

Since the IC chips are accommodated inside the insulating substrate, it is possible to provide a high-frequency module which is thinner and has IC chips with little breakage compared to a related high-frequency module.

Since the insulating substrate is formed of ceramic thin plates comprising a material which can be baked at a low temperature, the conductive members, connection conductors, and electrodes can be formed of silver, so that it is possible to provide a high-frequency module which has little electrical loss and which can be reliably soldered to a circuit board.

Since the insulating layer is formed of glass or polyimide, it has a smooth surface, so that the wiring pattern and the electrical part can be formed with high precision using thin films.

Since the top end of each of the connection conductors has a protrusion which protrudes from the top surface of the insulating substrate, and each protrusion is flush with or protrudes from the surface of the insulating layer, so that the wiring pattern is in electrical conduction with each protrusion, the connection conductors and the wiring pattern are easily brought into electrical conduction, so that high productivity is achieved.

Since a sealant, formed of an insulating material, fills the recesses of the insulating substrate accommodating the IC chips, the IC chips are reliably protected, so that a high-frequency module having IC chips with less breakage can be provided.

Since the IC chips are formed using bare chips, the IC chips are inexpensive.

What is claimed is:

1. A high-frequency module comprising:

an insulating substrate comprising a plurality of ceramic thin plates stacked in layers; and an insulating layer disposed on a top surface of the insulating substrate;

wherein a thin-film circuit is disposed on a top surface of the insulating layer, the thin-film circuit comprising a wiring pattern and an electrical part comprising one of a resistor and a capacitor, the wiring pattern being formed of a thin film, the electrical part being connected to the wiring pattern and being formed of a thin film;

wherein the insulating substrate has at least one conductive member disposed between the layers forming the insulating substrate, a first connection conductor and a second connection conductor disposed in a thickness direction, and an electrode disposed on a side surface of the insulating substrate with the electrode being connected to the conductive member;

wherein a top end of the first connection conductor has a first protrusion, a top end of the second connection conductor has a second protrusion, the first and second protrusions protrude from the top surface of the insulating substrate, each of the first and second protrusions is flush with or protrudes from the top surface of the insulating layer, and a top end of each of the first and second protrusions does not have the insulating layer formed thereon, wherein the first and second protrusions are connected to the wiring pattern; and wherein the second connection conductor is connected to an integrated circuit chip accommodated inside the insulating substrate.

2. A high-frequency module according to claim 1, wherein the ceramic thin plates forming the insulating substrate comprise a material which can be baked at a low temperature, and wherein the insulating layer is formed of one of glass and polyimide.

3. A high-frequency module according to claim 1, wherein a sealant, formed of an insulating material, fills a recess of the insulating substrate accommodating the integrated circuit chip.

4. A high-frequency module according to claim 1, wherein the integrated circuit chip is formed of a bare chip.

* * * * *